(12) United States Patent
Karni et al.

(10) Patent No.: US 10,446,412 B2
(45) Date of Patent: Oct. 15, 2019

(54) PRINTING OF MULTI-LAYER CIRCUITS

(71) Applicant: PRINTCB LTD., Nes Ziona (IL)

(72) Inventors: Yiftah Karni, Rehovot (IL); Steve Daren, Nes Ziona (IL)

(73) Assignee: PRINTCB LTD., Nes Ziona (IL)

( * ) Notice: Subject to any disclaimer, the term of this patent is extended or adjusted under 35 U.S.C. 154(b) by 0 days.

(21) Appl. No.: 15/566,013

(22) PCT Filed: Apr. 12, 2016

(86) PCT No.: PCT/IL2016/050382
§ 371 (c)(1),
(2) Date: Oct. 12, 2017

(87) PCT Pub. No.: WO2016/166751
PCT Pub. Date: Oct. 20, 2016

(65) Prior Publication Data
US 2018/0114703 A1    Apr. 26, 2018

Related U.S. Application Data

(60) Provisional application No. 62/146,452, filed on Apr. 13, 2015.

(51) Int. Cl.
*H01L 21/48*   (2006.01)
*H01B 1/22*    (2006.01)
(Continued)

(52) U.S. Cl.
CPC ........... *H01L 21/4867* (2013.01); *H01B 1/20* (2013.01); *H01B 1/22* (2013.01);
(Continued)

(58) Field of Classification Search
CPC . H01L 21/4867; H01L 23/488; H05K 3/1283; H05K 3/4679; H05K 2203/0126; H01B 1/20
See application file for complete search history.

(56) References Cited

U.S. PATENT DOCUMENTS 5,716,663 A * 2/1998 Capote ............... B23K 35/0222
156/277
6,268,920 B1 * 7/2001 Ohlig ........................ G03F 9/00
356/399
(Continued)

FOREIGN PATENT DOCUMENTS

EP   0793405    9/1997
GB   2050702 A  1/1981
(Continued)

OTHER PUBLICATIONS

International Search Report and Written Opinion in International Application No. PCT/IL2016/050382, dated Jul. 31, 2016.

*Primary Examiner* — Jay C Chang
*Assistant Examiner* — Mikka Liu
(74) *Attorney, Agent, or Firm* — J.A. Lindeman & Co. PLLC; Jeffrey Lindeman; Joseph Parisi

(57) ABSTRACT

A sheet-fed system designed to print multilayer PCBs is introduced. The system consists of four main blocks; a drilling station, a patterning station, a stacking/bonding station, and a sintering zone. The substrate PCB is shuttled between these various stations, to have vias drilled, to be attached to stacks of previously-processed layers, to be covered with conductive paths by means of the aforementioned ink, and to have the ink sintered under a controlled temperature and atmosphere. Patterning is accomplished by means of a novel two-step method involving both high-temperature conductive elements, low-temperature conductive elements, and flux. Two such compositions are successively applied and individually sintered to form a single conductive path; the second application serves to fill the porosities of the first layer. By this method, a highly-conductive trace is obtained without requiring high tempera-
(Continued)

tures, which in turn allows use of common substrates including polymers.

9 Claims, 5 Drawing Sheets

(51) Int. Cl.
    *H01L 23/498*     (2006.01)
    *H05K 1/09*     (2006.01)
    *H05K 3/12*     (2006.01)
    *H05K 3/46*     (2006.01)
    *H01B 1/20*     (2006.01)
    *H05K 3/24*     (2006.01)
    *H01L 23/488*     (2006.01)

(52) U.S. Cl.
    CPC ....... *H01L 23/49883* (2013.01); *H05K 1/097* (2013.01); *H05K 3/1283* (2013.01); *H05K 3/245* (2013.01); *H05K 3/4664* (2013.01); *H05K 3/4679* (2013.01); *H01L 23/488* (2013.01); *H05K 3/1241* (2013.01); *H05K 3/4673* (2013.01); *H05K 3/4682* (2013.01); *H05K 2201/0272* (2013.01); *H05K 2203/0126* (2013.01); *H05K 2203/1131* (2013.01); *H05K 2203/1476* (2013.01)

(56) References Cited

U.S. PATENT DOCUMENTS

| | | | |
|---|---|---|---|
| 2001/0028454 A1* | 10/2001 | Savareigo | ........ G01N 21/95692 |
| | | | 356/237.5 |
| 2004/0151893 A1 | 8/2004 | Kydd | |
| 2006/0159899 A1 | 7/2006 | Edwards | |
| 2006/0197064 A1 | 9/2006 | Pan | |
| 2012/0321805 A1 | 12/2012 | Takahashi | |
| 2014/0042212 A1 | 2/2014 | Shearer | |

FOREIGN PATENT DOCUMENTS

| | | |
|---|---|---|
| JP | 2010272835 A | 12/2010 |
| WO | 98/08362 | 2/1998 |
| WO | 00/59645 | 10/2000 |
| WO | 2013/027781 | 2/2013 |

* cited by examiner

PRINTING OF MULTI-LAYER CIRCUITS

This application claims priority from U.S. provisional patent 64/146,452 filed 13 Apr. 2015.

FIELD OF THE INVENTION

The present invention relates generally to the field of multilayer printed circuit boards.

BACKGROUND OF THE INVENTION

Printed circuit boards (hereinafter, PCBs) are the backbone of almost every electronic device. Modern consumer electronics, the automotive industry, medical devices, and industrial equipment of all varieties are controlled to an increasing degree by electronic circuits, which in turn require development of tens of thousands of new boards every year. This trend will grow as time-to-market and innovation have become major competitive advantages. Despite this trend, to date there are currently no efficient tools to assist production of reliable PCB prototypes which are required during the validation stages of a new product. In the course of product development, a board designer will typically order 2-3 prototype versions to validate and test the electronic performance of a device. Such prototypes are usually produced either by local small-medium PCB manufacturers or by Far East manufacturers (mainly China). They offer relatively fast delivery depending on the board complexity, which is mainly related to the number of layers and the circuit density. Such prototypes can be very expensive and may take a few weeks to manufacture. Several attempts to deliver prototype manufacturing solutions such as CNC or Laser based machinery for accurate etching of copper have proved unsuccessful mainly due to their complexity and it to reliably simulate "real" PCBs. Therefore these methods have not been widely adopted the industry.

The rapid evolution of 3D printing and additive manufacturing systems during the last few years raises new opportunities. It is more than reasonable to predict that these technologies will produce some innovative solutions in the realm of PCB and printed electronics manufacturing in the next few years. A few 3D printers featuring conductive inks for simple electronics applications have already appeared but a system that can produce a commercial multilayer PCB prototype using some type of 3D printing technology is still lacking, and would fulfill a long-felt need.

SUMMARY OF THE INVENTION

We introduce a sheet-fed system designed to print multilayer PCBs using a novel method. The system consists of four main blocks; a drilling station, a patterning station, a stacking/bonding station, and a sintering zone. The substrate PCB is shuttled between these various stations, to have vias drilled, to be attached to stacks of previously-processed layers, to be covered with conductive paths by means of the aforementioned ink, and to have the ink sintered under a controlled temperature and atmosphere, respectively.

The patterning is accomplished by means of a novel two-step method involving both high-temperature conductive elements, low-temperature conductive elements, and flux. Two such compositions are successively applied and individually sintered to form a single conductive path; the second application serves to fill the porosities of the first layer. By this method, a highly-conductive trace is obtained without requiring high temperatures, which in turn allows use of common substrates including polymers.

The foregoing embodiments of the invention have been described and illustrated in conjunction with systems and methods thereof, which are meant to be merely illustrative, and not limiting. Furthermore just as every particular reference may embody particular methods/systems, yet not require such, ultimately such teaching is meant for all expressions notwithstanding the use of particular embodiments.

BRIEF DESCRIPTION OF THE DRAWINGS

Embodiments and features of the present invention are described herein in conjunction with the following drawings.

DEFINITIONS

Figure 1:
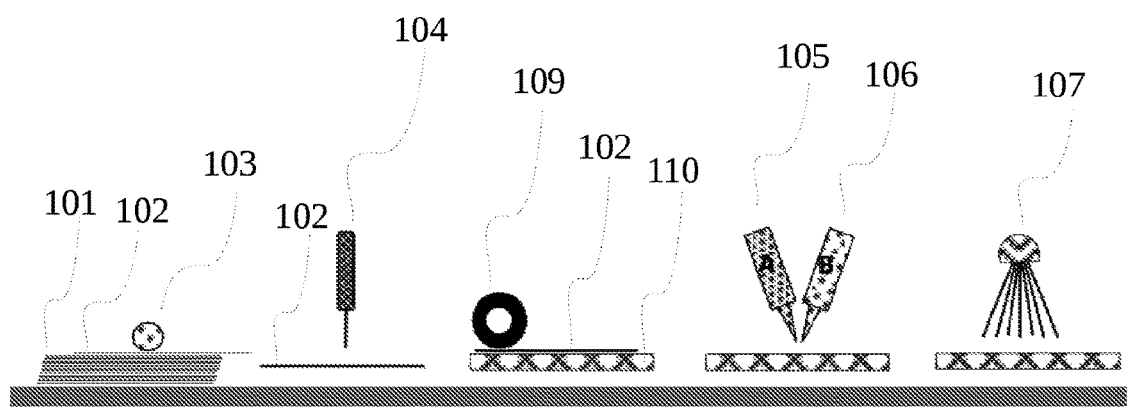
FIGS. 1,2 depict the main system elements and fabrication process flow.

Hereinafter, the term 'via', or 'vertical interconnect access', is an electrical connection between layers in a multi-layer PCB, which travels through the plane of one or more adjacent layers.

The term 'blind via' is used to denote a via used to connect an outer PCB layer with at least one inner layer of a multi-layer PCB.

The term 'buried via' refers to a via connecting at least two inner layers of a multi-layer PCB.

The term through-hole refers to a via around a hole passing through all layers of a multilayer PCB.

The term 'trace' or 'signal trace' refers to a conducting path consisting of a flat, narrow conductive path.

DETAILED DESCRIPTION OF PREFERRED EMBODIMENTS

The present invention will be understood from the following detailed description of preferred embodiments, which are meant to be descriptive and not limiting. For the sake of brevity, some well-known features, methods, systems, procedures, components, circuits, and so on, are not described in detail.

The inventive system is a sheet-fed system designed to print multilayer PCBs using a novel conductive ink. This ink is printed onto standard commercial thin insulator sheets which are widely used in the PCB industry, such as Epoxy, FR4, Polyamides, Kapton and others.

The system consists of several 'stations' each performing a certain operation, in the manner of an automated assembly line. A drilling station, a stacking unit, a patterning station and a sintering zone are illustrated schematically in FIG. 1.

The feeder 101 containing multiple single-layer sheets feeds out a single PCB substrate layer 102, using roller 103 to pay out the new single PCB layer.

The drilling station 104 is used to form holes through single or multiple PCB layers 102 and thus allows for creation of vias.

The drilling station 104 is fed, either manually or automatically, with a single sheet per layer. This sheet is aligned (mechanically, optically, or otherwise) and vias (at this point simply holes, until the sheet is attached to other layers) are drilled according to their coordinates in a Gerber (or any other format) file of the layer.

Different drill diameters are available in order to allow for various via dimensions. An automatic optical inspection camera inspects the surface of the sheet upon conclusion of the drilling step, to verify the vias' integrity.

In some embodiments of the invention, the mechanical drilling apparatus may be replaced by a laser drill to allow faster performance as well as smaller via dimensions.

The stacking unit 109 aligns and attach a drilled substrate 102 on the multilayer PCB substrate 110. The multilayer PCB substrate 110 is formed from several individual layers such as 102, glued or otherwise attached to one another.

The conductor patterning station has two individual conductor component dispensers 105, 106 adapted to form highly conductive traces as described above, namely by dispensing a first layer (e.g. from dispenser 105), sintering it (at the next station), and then laying down a second layer (e.g. from dispenser 106) that largely fills the porosities of the first layer.

The sintering station 107 allows for partially melting the conductive components laid down by the patterning station.

The substrate layer 102 and multilayered PCB 110 are shuttled between these various stations: drilled, stacked successively, covered with conductive paths, and sintered to form multilayer PCBs 110.

The transport of the substrate between processing stations is shown schematically in FIG. 2a-i, where the successive positions of the single substrate layer 102 are shown in representative individual steps a-i. First an individual PCB layer sheet 102 is extruded or rolled from a cartridge into position, FIG. 2a. After the sheet is ready and positioned, it is moved to the drilling station as in FIG. 2b, where it is aligned (registered) and drilled. When the sheet is ready with all the vias drilled and is validated, The single sheet 102 is aligned with previously-processed layers 110 (assuming there are such), in one embodiment making use of the drill pattern either mechanically or by an automatic optical system (or both) to ensure tight registration. Except for the case of the very first sheet, the single sheets 102 can be glued on top of previous finished layers of the processed PCB 110 either by means of thin, high temperature-compatible adhesive film (such as 3M VHB Adhesive Transfer Tape) or by means of hot-press to a prepreg intermediate layer. Pressure is applied mechanically with a roller 109 or by any other means. The roller can be either cold or hot. This gluing step may be accomplished at the same station as one of the other steps, or at a dedicated station. In one embodiment of the invention, the gluing can be done in two steps. In such embodiments, a first 'soft' gluing is performed during the layering of the PCB stack 110, and a final 'hard' gluing is performed after all layers are stacked.

Figure 2:
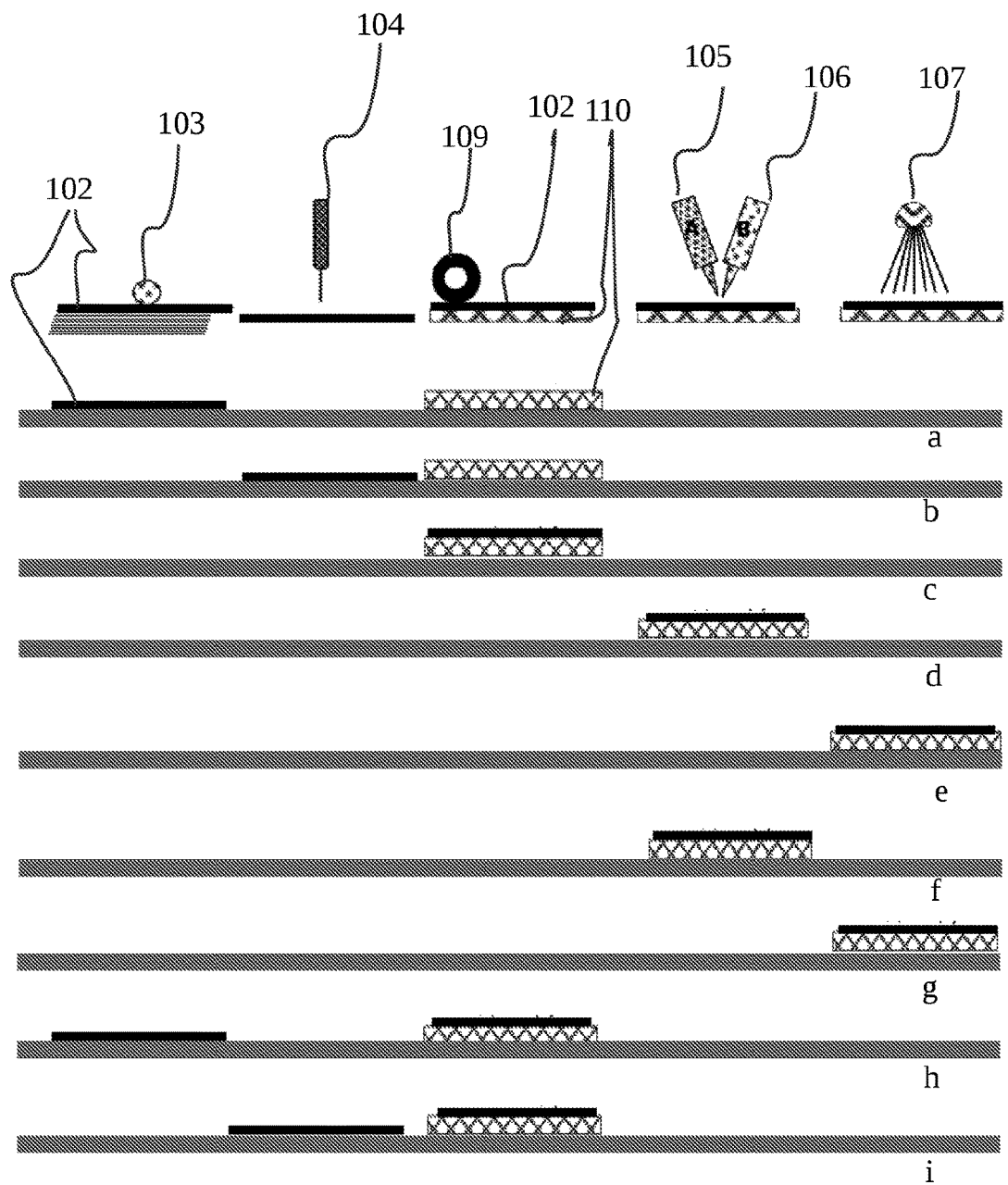

It is within provision of the invention that a dedicated gluing station be employed to bind the new top layer 102 to the extant processed layers 110, as shown in FIGS. 1,2.

The conductive route patterning devices, (which typically comprise a dispenser, inkjet head or any other suitable kind of injection device) then applies the conductive ink according to the patterning process to be described in detail below. This step includes deposition of traces, vias, pads etc. The printing algorithm can be line by line (raster), vector, or any other method depending on the device mobility (i.e. whether the patterning device is mounted on a scanner, articulated arm or other motion assembly).

The inventive process involves deposition of two conductive inks, overlaid in two steps. Thus each ink (in some embodiments) has its own nozzle and cartridge, with the deposited layer paths being aligned to within a fine tolerance. Alternatively, these two steps may be consolidated into one step, for instance with different compositions being extruded from a single printhead, or by use of two passes of the same composition extruded from a single printhead.

After deposition of all the conductive features of a layer as in FIG. 2d, the conductive ink is sintered at the sintering station 107 as in 2e. Then the layer is returned to the patterning station 105,106 for the second layer of conductive ink to be deposited, as in FIG. 2f. Subsequently it is returned for a second sintering step, FIG. 2g.

The next sheet is dispensed (FIG. 2h), drilled (FIG. 2i) and then as before is aligned and attached on top of the already-processed PCB stack by means of a thin adhesive material or by a thin prepreg layer. Then, the next conductive features are printed at the patterning station according to the layout of the next sheet. This process is repeated N times (for a multilayer PCB of N layers) until the last (top) layer is fully printed and sintered.

When the last layer has been stacked, printed and sintered, an additional layer after drilling is attached, acting as a solder mask for the component assembly stage. Upon completion, the entire stack is transferred back to the drilling station and the board is cut to its final external dimensions.

Additional finishing steps such as silk printing, legend printing and solder mask printing can be further incorporated either offline or in-line with this system.

Conductive Ink and Patterning Process

Figure 3:
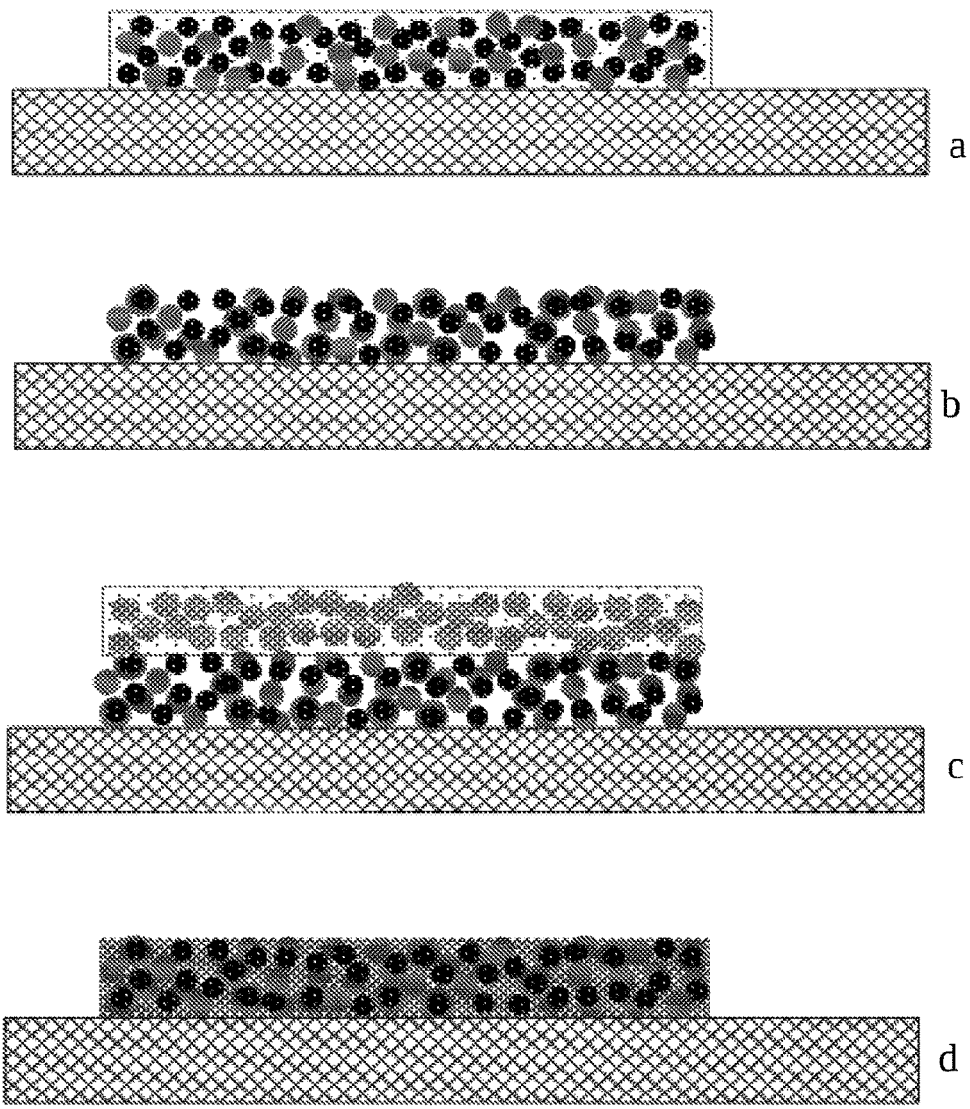
FIG. 3 shows the conductive ink process.

The conductive ink is made by depositing two materials, hereinafter referred to as Ink A and Ink B—one on top of the other, in two steps, as described above and as shown in detail in FIG. 3. The rationale behind this process is to enable a film that is at once thin, highly conductive, and which does not require any high-temperature processing.

Ink A determines the physical dimensions of the layer (namely the width and thickness, as well as a degree of conductivity), and these parameters can be controlled to an extent as will be familiar to one skilled in the art of 3D printing. Ink B provides the high conductivity properties while maintaining the structure defined by Ink A. As an example, the resistivity after the first sintering step may be 20-50 uOhm-cm, and after sintering of the $2^{nd}$ layer it has decreased to approx. 10 uOhm-cm. This surprising result will be explained below.

Ink A is composed of a mixture of a high melting point metallic powder, such as copper, silver, gold etc., and a low melting point metallic powder, such as zinc, tin, lead, alloys of such metals, etc., plus a flux paste, either organic, inorganic, or a mixture thereof. The ratio of high melting point powder to low melting point powder may vary between 5:1 and 1:5, while the flux content may be 10%-20% by weight.

Ink B is a mixture low melting point metallic powder, such as commercial solder alloys etc., and flux paste at an appropriate ratio of 10%-20% by weight.

Sintering powders made of materials with high electrical conductivity, such as copper or silver, on a polymeric substrate is impossible due to temperature limitations of the polymer, which will decompose at relatively low temperature. Lowering the sintering temperature can be achieved by mixing such powder with a low melting point powder such as tin alloy. However, when such sintering is done without applying pressure, the layers obtained are highly porous and their conductivity is poor. In order to lower the porosity to a minimum, the second step of the invention is applied. Densification is obtained in a capillary flow manner by melting a metal with a low melting point, such as solder alloy, over the sintered porous first layer. As in other soldering processes, use of flux is desirable to ensure the wetting of the two materials. The second layer effectively 'fills the gaps' left in the first layer, thus achieving a far higher level of conductivity without requiring high sintering temperatures.

The conductivity of the printed pattern can be estimated as the weighted average of the conductive metal/alloys involved, reduced by the resistances of the mating surfaces.

The patterning process is shown in FIG. 3a-d. The patterning process proceeds as follows: a first layer is printed with Ink A (by writing with head A of FIGS. 1,2) on the surface of the substrate film (FIG. 3a). These traces are then sintered by means of an external heating source, such as a radiative heat source (focused IR, halogen lamp, laser beam, etc.). On hardening, Ink A transforms into a somewhat conductive, porous film as in FIG. 3b.

Then, a second layer composed of Ink B is applied directly on top of ink A by printing head B, as in FIG. 3c. Upon heating, Ink B melts and is absorbed into the pores of film A to form a more fully solid layer with outer dimensions determined by ink A (very similar to the way a sponge absorbs water), as shown in FIG. 3d.

The dimensions of the final conductive layer (A+B), as well as via filling, are largely determined by the outer dimensions of layer A so long as liquid B does not overfill the pores of layer A.

The ratio between materials A and B on printing is in a range of 1/5-5/1; a ratio of 1/1 is a reasonable example.

The second layer serves to fill the open porosities left after sintering of the first layer, thereby dramatically increasing the conductivity of the resulting layer without requiring high sintering temperatures.

The Stacking Process

Figure 4:
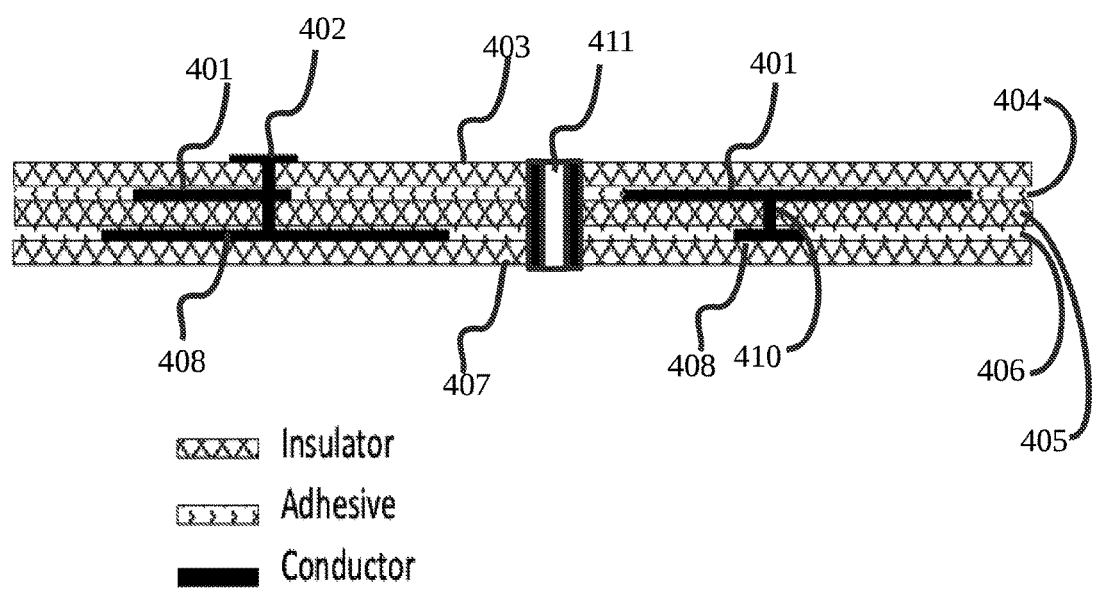
FIG. 4 shows a printed stack of 3 layers (cross section)

As described above, after the drilling processes is completed, each sheet is aligned and stacked on top of its preceding (already printed) layer. The final result of this process is shown in detail in the cross section shown in FIG. 4. Printing of a layer begins only after it is stacked upon the preceding layers. Here the bottom PCB layer 407 has had conductive ink traces 408 deposited on it as described above. An adhesive layer 406 was then glued on top and a second layer 405 attached onto the first layer, after vias such as that shown at 410 were drilled at the drilling station. Conductive ink paths 401 are then deposited and sintered in turn onto the second layer 405 as described above. Once again an adhesive layer 404 is deposited onto the middle PCB layer 405 and a top PCB layer 403 attached, after having been drilled with vias 402; it is then printed with conducting ink and the multilayer PCB is ready for use.

Vias 411 passing through the entire stack may be drilled after assembly of all the layers.

Figure 5:
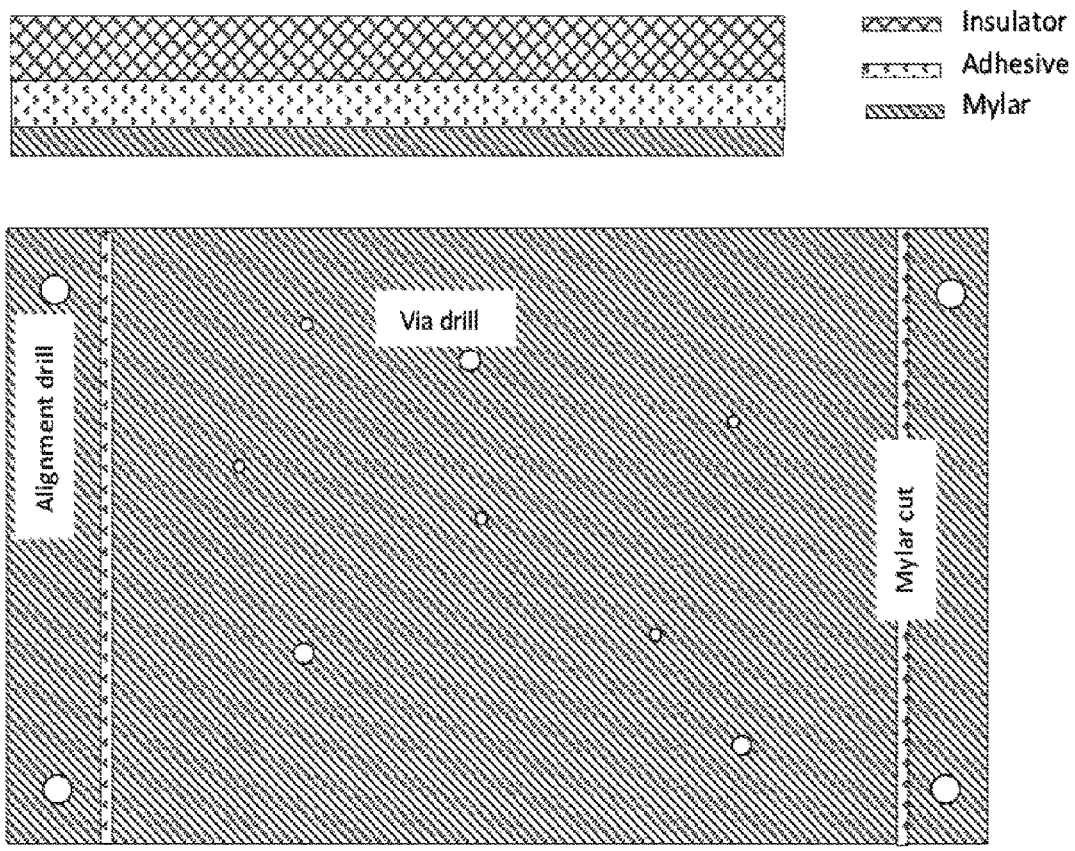
FIG. 5 shows a treated sheet cross section and drilled sheet in reverse-side view.

In order to promote good adhesion between two adjacent layers during the entire manufacturing process and during the reflow process thereafter, by which electrical components are soldered to the PCB, a high temperature adhesive is used, such as a 3M VHB Adhesive Transfer Tape or others. In one embodiment, a thin adhesive layer protected by a Mylar film is applied to the reverse side of each insulator sheet reverse sides. Another alternative for layer adhesion is the use of a pre-impregnated glass-epoxy intermediate layer called prepreg, that can be placed between 2 adjacent layers and then pressed in the presence of heat. In FIG. 5 a series of registration holes and release cuts in the treated sheet are shown. These allow alignment of the sheet to the printing system coordinates and easy removal of the Mylar just before the sheet is attached to the sheet below it in the stack.

Such a sheet, with a reverse-side Mylar film and an enclosed adhesive, allows for easy handling during drilling of the vias, protects the adhesive layer, and allows easy alignment to the preceding layer before and after removal. The new sheet is attached to the stack in such a way as to ensure smooth, wrinkle-less adhesion. In case a thicker insulating layer is required, multiple sheets can be drilled and then stacked, while only the last one is printed. This process can be performed manually or automatically.

Consumable parts in the system include:
1. The ink cartridges (inks A and B)
2. The sheets (various materials, with adhesive, Mylar, holes and release cuts)

Board Finishing

In the traditional multilayer PCB process, a bare board undergoes several finishing processes to ensure successful component placement and attachment via solder reflow. The main process steps involved are:
1. Solder masking: deposition of an insulator material to ensure that solder drops are confined and don't create a short between two adjacent pads. This also prevents contamination of the top surface.
2. Gold or Silver coating on the exposed pads to ensure good solder-ability to the underlying copper (which oxidizes otherwise).
3. Solder paste printing: placing solder paste drops on the pads.
4. Component placement according to the layout—usually done by a robot.
5. Reflow furnace soldering: hot air oven with a defined temperature profile (according to the solder used and loaded board heat capacity) to ensure that the components are solidly connected to the board.

With the exception of step 4, the system in accordance with an embodiment of the invention is able to perform all of these steps, or equivalent ones, to allow the creation of a fully assembled board. It is further within provision of the invention to employ a pick-and-place robot to perform step 4 and thereby allow for a full end-to-end PCB prototyping device.

1. Solder masking: instead of insulator deposition, a thin insulating sheet can be placed on top of the upper layer, in the same way as described for our stacking process (see FIG. 5).
2. The conductive material described (FIG. 3) is not oxidation prone and contains a significant volume of solder, which enables very good adhesion to the solder in the soldering step. This may eliminate the need for gold or silver coating when using our system.
3. Solder paste printing: our system is capable of depositing solder in discrete locations as described in the System section.
4. Placement: requires dedicated equipment which may be incorporated in the invention.
5. Reflow: the system is capable of creating a well-defined temperature profile using the heater used for the sintering process (FIG. 1).

It is within provision of the invention that the PCB can be made flexible. This ultimately depends on the type of adhesive used. Acrylic adhesive will give a flexible PCB while prepreg adhesion will result in a rigid one.

Such flexible PCBs will find use in a number of applications such as flexible displays, wearable electronics, hinged or otherwise movable parts, energy harvesting devices, and others.

The foregoing description and illustrations of the embodiments of the invention has been presented for the purposes of illustration. It is not intended to be exhaustive or to limit the invention to the above description in any form.

Any term that has been defined above and used in the claims, should be interpreted according to this definition.

The reference numbers in the claims are not a part of the claims, but rather used for facilitating the reading thereof. These reference numbers should not be interpreted as limiting the claims in any form.

The invention claimed is:

1. A method for deposition and patterning of highly conductive ink on insulating printed circuit board (PCB) materials comprises the steps of:
   a. providing a single PCB insulating layer at a predetermined position;
   b. drilling a set of holes of predetermined positions and diameters in said PCB insulating layer;
   c. forming a first trace layer onto said PCB insulating layer; wherein said forming the first trace layer comprises the steps of
      depositing a first ink composition composed of a mixture of a high melting point metallic powder, a low melting point metallic powder, and a flux paste, and sintering said first ink composition;
   d. forming a second trace layer onto said first trace layer; wherein said forming the second trace layer comprises the steps of
      depositing a second ink composition, composed of a mixture of a low melting point metallic powder and a flux paste, directly on top of the first trace layer, wherein the first ink composition is different from the second ink composition, and
      sintering said second ink composition;
   e. repeating steps a-d on each single PCB insulating layer.

2. The method of claim 1 further comprising multilayer stacking consisting of steps:
   a. attaching a high temperature adhesive layer protected by a Mylar film to a reverse side of each said single PCB insulating layer, drilling registration holes, via holes, and cut out release cuts;
   b. aligning said single PCB insulating layer to printing system coordinates;
   c. removing said Mylar film before said single PCB insulating layer is attached to a previously processed PCB layer below said single PCB insulating layer in a stack.

3. The method of claim 2 wherein said high temperature adhesive layer is a 3M VHB Adhesive Transfer Tape or prepreg material.

4. The method of claim 1, further comprising an attachment step after step b, wherein said attachment step comprises attaching said single PCB insulating layer at a predetermined position to the layers already processed in steps a-d by means of an adhesive layer.

5. The method of claim 1, wherein the second trace layer formed on the first trace layer is absorbed into pores of the first trace layer following sintering in step d, thereby forming a solid layer with outer dimensions determined by dimensions of the first trace layer.

6. A set of compositions for depositing two-layered conductive traces comprising a first and second composition, said first composition being composed of a mixture of a high melting point metallic powder, a low melting point metallic powder, and a flux paste; ratio of the high melting point powder to the low melting point powder being between 5:1 and 1:5 and the flux paste content being 10%-20% by weight; said second composition being a mixture of a low melting point metallic powder and a flux paste, wherein the flux paste content is 10%-20% by weight; wherein said first composition is different from said second composition.

7. The set of compositions of claim 6, wherein the high melting point metallic powder is selected from the group consisting of copper, silver, gold, and mixtures thereof.

8. The set of compositions of claim 6, wherein the low melting point metallic powder is selected from the group consisting of zinc, tin, lead, alloys of such metals, and mixtures thereof.

9. The set of compositions of claim 6, wherein the flux paste is organic, inorganic, or a mixture thereof.

* * * * *